(12) United States Patent
Chow et al.

(10) Patent No.: US 7,741,896 B2
(45) Date of Patent: Jun. 22, 2010

(54) HIGH VOLTAGE DRIVE CIRCUIT EMPLOYING CAPACITIVE SIGNAL COUPLING AND ASSOCIATED DEVICES AND METHODS

(75) Inventors: Fun Kok Chow, Singapore (SG); Gek Yong Ng, Singapore (SG); Richard Kok Keong Lum, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 221 days.

(21) Appl. No.: 12/163,275

(22) Filed: Jun. 27, 2008

(65) Prior Publication Data

US 2009/0206817 A1    Aug. 20, 2009

Related U.S. Application Data

(63) Continuation-in-part of application No. 12/032,165, filed on Feb. 15, 2008.

(51) Int. Cl.
*H03K 17/687* (2006.01)
(52) U.S. Cl. ...................... 327/427; 257/500
(58) Field of Classification Search ................ 327/108, 327/427, 434, 435; 257/500; 323/303
See application file for complete search history.

(56) References Cited

U.S. PATENT DOCUMENTS

| | | | |
|---|---|---|---|
| 4,799,092 A * | 1/1989 | Klaassen ..................... | 257/369 |
| 4,989,127 A * | 1/1991 | Wegener ..................... | 363/16 |
| 5,530,277 A * | 6/1996 | Otsuki et al. ................ | 257/378 |
| 5,561,393 A * | 10/1996 | Sakurai et al. .............. | 327/442 |
| 5,625,265 A | 4/1997 | Vlahu | |
| 5,693,871 A | 12/1997 | Gonzales | |
| 5,693,971 A | 12/1997 | Gonzalez | |
| 5,945,728 A | 8/1999 | Dobkin et al. | |
| 6,137,827 A | 10/2000 | Scott | |
| 6,167,475 A | 12/2000 | Carr | |
| 6,215,377 B1 | 4/2001 | Douriet et al. | |
| 6,320,532 B1 | 11/2001 | Diede | |
| 7,136,274 B2 | 11/2001 | Diede | |
| 6,489,850 B2 | 12/2002 | Heineke et al. | |
| 6,538,313 B1 | 3/2003 | Smith | |
| 6,563,211 B2 * | 5/2003 | Fukada et al. ............... | 257/706 |
| 6,574,091 B2 | 6/2003 | Heineke et al. | |

(Continued)

FOREIGN PATENT DOCUMENTS

WO     WO 2005/001928     6/2005

OTHER PUBLICATIONS

ACCL-9xxx 3.3V/5V High Speed CMOS Capacitive Isolator, Preliminary Datasheet, Avago Technologies, Date unknown.

(Continued)

*Primary Examiner*—Adolf Berhane
*Assistant Examiner*—Yemane Mehari

(57) ABSTRACT

According to one embodiment, there is provided a high voltage drive circuit comprising drive and sense electrodes formed substantially in a single plane. The device effects signal transfer between drive and receive circuits through the drive and sense electrodes by capacitive means, and permits high voltage devices, such as IGBTs, to be driven thereby without the use of high voltage transistors, thereby eliminating the need to use expensive fabrication processes such as SOI when manufacturing high voltage gate drive circuits and ICs. The device may be formed in a small package using, by way of example, using CMOS or other conventional low-cost semiconductor fabrication and packaging processes.

34 Claims, 10 Drawing Sheets

U.S. PATENT DOCUMENTS

| | | |
|---|---|---|
| 6,583,681 B1 | 6/2003 | Makino et al. |
| 6,583,976 B1 * | 6/2003 | Murahashi et al. .......... 361/100 |
| 6,661,079 B1 | 12/2003 | Bikulcius et al. |
| 6,944,009 B2 | 9/2005 | Nguyen et al. |
| 6,960,945 B1 * | 11/2005 | Bonin ........................ 327/111 |
| 7,016,490 B2 | 3/2006 | Beutler et al. |
| 7,170,807 B2 | 1/2007 | Franzen et al. |
| 7,331,723 B2 | 2/2008 | Yoon et al. |
| 7,379,037 B2 * | 5/2008 | Takeuchi et al. ........... 345/75.2 |
| 7,394,337 B2 | 7/2008 | Arai et al. |
| 2006/0095639 A1 | 5/2006 | Guenin et al. |
| 2007/0008679 A1 * | 1/2007 | Takahasi et al. ............. 361/600 |
| 2007/0025123 A1 | 2/2007 | Kim et al. |
| 2007/0162645 A1 | 7/2007 | Han |
| 2008/0179963 A1 | 7/2008 | Fouquet et al. |

OTHER PUBLICATIONS

Texas Instruments Dual Digital Isolators, SLLS755E, Jul. 2007.
U.S. Appl. No. 11/264,956, filed Nov. 1, 2005, Guenin et al.
ACCL-9XXX, *3.3V/5V Hight speed CMOS Capacitive Isolator, Preliminary Datasheet, Avago Technologies, Date Unknown*.
Texas Instruments Dual Digital I, *SLLS755E* Jul. 2007.

* cited by examiner

HIGH VOLTAGE DRIVE CIRCUIT EMPLOYING CAPACITIVE SIGNAL COUPLING AND ASSOCIATED DEVICES AND METHODS

RELATED APPLICATION

This application is a continuation-in-part of U.S. patent application Ser. No. 12/032,165 filed Feb. 15, 2008 entitled "High Voltage Isolation Semiconductor Capacitor Digital Communication Device and Corresponding Package" to Fun Kok Chow et al. and claims priority and other benefits therefrom, the entirety of which is hereby incorporated by reference herein.

FIELD OF THE INVENTION

Various embodiments of the invention described herein relate to the field high voltage drive circuits.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required. Prior art magnetic devices typically achieve high voltage isolation by employing opposing inductively-coupled coils, also usually require high power levels (especially when high data rates required), typically require the use of at least three separate integrated circuits or chips, and are susceptible to electromagnetic interference ("EMI"). Prior art capacitive devices typically achieve high voltage isolation by employing multiple pairs of transmitting and receiving electrodes, where for example a first pair of electrodes is employed to transmit and receive data, and a second pair of electrodes is employed to refresh or maintain the transmitted signals.

Some high voltage isolation communication devices, typically employed in power systems, are implemented in high voltage integrated circuits (HVICs) and are configured to provide level shifting and gate drives for high side insulated-gate bipolar transistors (IGBTs). Conventional HVIC gate drives require the use of high voltage transistors to implement high voltage level shift functionality. Such HVIC gate drives usually require the use of complex and expensive high voltage manufacturing processes, such as silicon-on-insulator (SOI) technology, which substitutes a layered silicon-insulator-silicon substrate for a conventional silicon substrate in the semiconductor manufacturing process. The major disadvantages of SOI implementation are increased manufacturing complexity and a significant increase in substrate cost. Furthermore, the cost of using SOI technology scales with the level of high voltage stress between the low and high side of the gate drive, which further increases cost.

What is needed is a high voltage isolation communication device that is small, consumes reduced power, permits data to be communicated at relatively high data rates, has improved high voltage breakdown capabilities, maintains high voltage isolation characteristics during operation, may be built at lower cost, and that is susceptible to being manufactured using conventional CMOS processes.

Further details concerning various aspects of some prior art devices and methods are set forth in U.S. Pat. No. 5,693,971 to Gonzales entitled "Combined trench and field isolation structure for semiconductor devices" dated Dec. 2, 1997; U.S. Pat. No. 6,167,475 to Carr entitled "Data transfer method/engine for pipelining shared memory bus accesses" dated Dec. 26, 2000; U.S. Pat. No. 6,215,377 to Douriet entitled "Low cost wideband RF port structure for microwave circuit packages using coplanar waveguide and BGA I/O format" dated Apr. 10, 2001; U.S. Pat. No. 6,320,532 to Diede entitled "Low power radar level transmitter having reduced ground loop errors" dated Nov. 20, 2001; U.S. Pat. No. 6,489,850 to Heineke et al. entitled "Crosstalk suppression in differential AC coupled multichannel IC amplifiers" dated Dec. 3, 2002; U.S. Pat. No. 6,538,313 to Smith entitled "IC package with integral substrate capacitor" dated Mar. 25, 2003; U.S. Pat. No. 6,574,091 to Heineke et al. entitled "Multi-plate capacitor structure" dated Jun. 3, 2003; U.S. Pat. No. 6,661,079 to Bikulcius entitled "Semiconductor-based spiral capacitor" dated Dec. 9, 2003; U.S. Pat. No. 6,944,009 to Nguyen et al. entitled "Ultra broadband capacitor assembly" dated Sep. 13, 2005; U.S. Pat. No. 7,170,807 to Fazan et al. entitled "Data storage device and refreshing method for use with such device" dated Jan. 30, 2007; U.S. Patent Publication No. 2007/0133,933 to Hoon entitled "Enhanced coplanar waveguide and optical communication module using the same" dated Jun. 14, 2007; U.S. Patent Publication No. 2007/0162645 to Han entitled "Communication system for data transfer between on-chip circuits" dated Jul. 12, 2007, U.S. patent application Ser. No. 11/264,956 to Guenin et al. entitled "Structures and methods for proximity communication using bridge chips" dated Nov. 1, 2005, and WO/2005/001928 to Hester et al. entitled "Capacitor-related systems for addressing package/motherboard resonance" dated Jun. 1, 2005. The foregoing patents and patent applications are hereby incorporated by reference herein, each in its respective entirety.

SUMMARY

In some embodiments, there is provided a high voltage drive circuit comprising at least one drive electrode comprising a drive input connected to a low voltage portion of the circuit, the drive electrode being formed of a first electrically conductive metal, metal alloy or metal mixture, at least one sense electrode comprising a sense output connected to a high voltage portion of the circuit, the sense electrode being formed of a second electrically conductive metal, metal alloy or metal mixture, an electrically conductive ground plane substrate spaced apart from the drive and sense electrodes by an electrically insulative layer, a drive circuit forming a portion of the low voltage portion and configured to receive an input signal provided to the high voltage drive circuit, the drive circuit being operably coupled to the drive input and configured to transmit a drive signal based on the input signal therethrough, and a receive circuit forming a portion of the high voltage portion and operably coupled to the sense output, the receiver circuit being configured to receive the drive signal transmitted between the sense and drive electrodes and to provide at least one gate drive output signal having power and amplitude sufficient to drive an insulated-gate bipolar transistor (IGBT). The drive and sense electrodes are substantially disposed in a single plane and are operably configured and associated in respect of one another to effect the transfer of drive signals therebetween by capacitive means, the gate drive circuit is a non-silicon-on-insulator CMOS integrated circuit, and high voltage isolation between the low and high voltage portions of the circuit is provided by the drive and sense electrodes through capacitive means.

In other embodiments, there is provided a method of making a high voltage drive circuit comprising providing at least one drive electrode comprising a drive input connected to a low voltage portion of the circuit, the drive electrode being formed of a first electrically conductive metal, metal alloy or metal mixture, providing at least one sense electrode comprising a sense output connected to a high voltage portion of the circuit, the sense electrode being formed of a second electrically conductive metal, metal alloy or metal mixture, providing an electrically conductive ground plane substrate spaced apart from the drive and sense electrodes by an electrically insulative layer, providing a drive circuit forming a portion of the low voltage portion and configured to receive an input signal provided to the high voltage drive circuit, the drive circuit being operably coupled to the drive input and configured to transmit a drive signal based on the input signal therethrough, and providing a receive circuit forming a portion of the high voltage portion and operably coupled to the sense output, the receiver circuit being configured to receive the drive signal transmitted between the sense and drive electrodes and to provide at least one gate drive output signal having power and amplitude sufficient to drive an insulated-gate bipolar transistor (IGBT). The drive and sense electrodes are substantially disposed in a single plane and are operably configured and associated in respect of one another to effect the transfer of drive signals therebetween by capacitive means, the gate drive circuit is a non-silicon-on-insulator CMOS integrated circuit, and high voltage isolation between the low and high voltage portions of the circuit is provided by the drive and sense electrodes through capacitive means.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

In some embodiments of the invention, a mutual-capacitance system is provided having co-planar sense and drive electrodes disposed substantially in a single plane. In other embodiments of the invention, there is provided a high voltage drive circuit which is incorporated into a non-silicon-on-insulator (non-SOI) CMOS device.

According to one embodiment, there is provided a semiconductor digital communication device comprising co-planar communication drive and sense electrodes formed in a single plane, where the electrodes have relatively high sidewalls. The relatively high sidewalls permit low electrical field densities to be obtained in the sense and drive electrodes during operation, and further permit very high breakdown voltages to be obtained between the electrodes, and between the drive electrode and an underlying ground plane substrate. The device effects communications between drive and receive circuits through the drive and sense electrodes by capacitive means, and in a preferred embodiment is capable of effecting relatively high-speed digital communications. The device may be formed in a small chip or package employing CMOS and other semiconductor fabrication and packaging processes.

Figure 1:
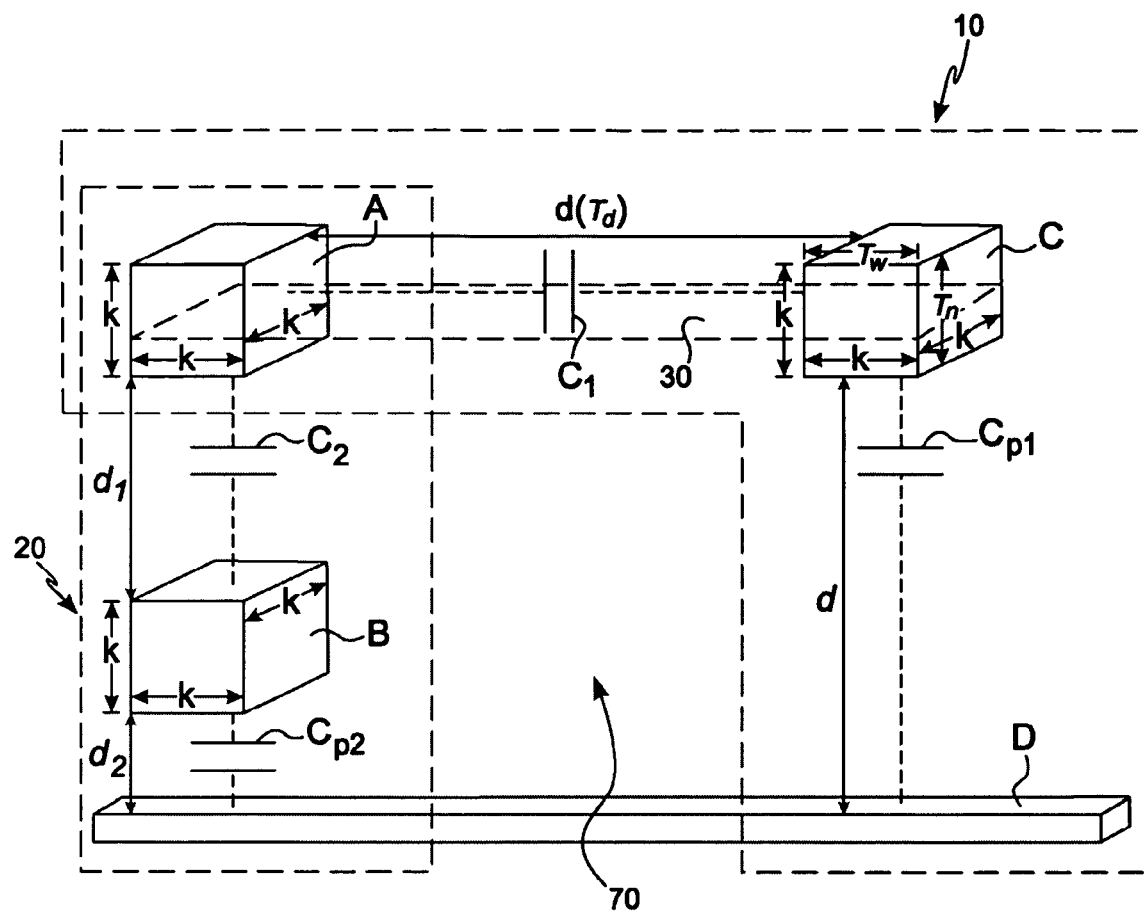
FIG. 1 shows horizontal and vertical capacitor structures.

FIG. 1 shows co-planar horizontal and stacked vertical capacitor structures 10 and 20, respectively. Co-planar horizontal capacitor structure 10 comprises electrodes A and C separated by distance d and characterized by capacitance C, therebetween, and electrode C and ground plane substrate D separated by distance d and characterized by parasitic capacitance $C_{p1}$. Vertical capacitor structure 20 comprises electrodes A and B separated by distance $d_1$ and characterized by capacitance $C_2$ therebetween, and electrode B and ground plane substrate D separated by distance $d_2$ and characterized by parasitic capacitance $C_{p2}$. As shown in FIG. 1, electrodes A, B and C have widths, heights and lengths all equaling k, which simplifies the derivation of equations 1 through 6 set forth below. Electrodes A and C are formed in an upper metal layer in horizontal capacitor structure 10, and electrode B is formed in a lower metal layer in vertical capacitor structure 20. In horizontal and vertical capacitor structures 10 and 20 illustrated in FIG. 1, it is assumed that capacitance arises from the surface areas presented by electrodes A, B and C only, and that fringe capacitance is zero.

In accordance with the foregoing assumptions, capacitances $C_1$ and $C_2$, parasitic capacitances $C_{p1}$ and $C_{p2}$, coupling efficiencies $C_{1eff}$ and $C_{2eff}$ may be calculated as follows:

$$C_1 = \epsilon k^2/d \quad \text{eq. (1),}$$

$$C_{p1} = \epsilon k^2/d \quad \text{eq. (2),}$$

$$C_{1eff} = C_1/(C_1+C_{p1}) = \frac{1}{2} \quad \text{eq. (3),}$$

$$C_2 = \epsilon k^2/d_1 \quad \text{eq. (4),}$$

$$C_{p2} = \epsilon k^2/d_2 \quad \text{eq. (5), and}$$

$$C_{2eff} = C_2/(C_2+C_{p2}) = d_2/(d_1+d_2) \quad \text{eq. (6),}$$

where $\epsilon$=the permittivity of a dielectric material disposed between electrodes A, B and C, and between such electrodes and substrate D. Note that in capacitor structures 10 and 20 illustrated in FIG. 1, electrode A is a drive electrode, and electrodes B and C are sense electrodes.

Referring to equation 6 above, it will be seen that if $d_1=d_2$, then $C_{2eff}=\frac{1}{2}$, which is the same coupling efficiency provided by $C_{1eff}$. However, the breakdown voltage between electrode A and electrode B for $C_{2eff}$ is lower than the breakdown voltage between electrode A and electrode C for $C_{1eff}$, since $d_1$ is less than d.

Continuing to refer to equation 6 above, it will be seen that if $d_1 < d_2$, then $C_{2eff} > \frac{1}{2}$, which is an even greater coupling efficiency provided by $C_{1eff}$. However, the breakdown voltage between electrode A and electrode B for $C_{2eff}$ in this case is now even lower than the breakdown voltage between electrode A and electrode C for $C_{1eff}$, since $d_1$ is much less than d.

Still referring to equation 6 above, it will be seen that if $d_1 > d_2$, then $C_{2eff} < \frac{1}{2}$, which is lower than the coupling efficiency provided by $C_{1eff}$. While the breakdown voltage between electrode A and electrode B for $C_{2eff}$ is better than in the two cases described above, it is still lower than the breakdown voltage between electrode A and electrode C for $C_{1eff}$, since $d_1$ is less than d.

The above calculations illustrate that in a capacitor design for a high voltage isolation semiconductor digital communication device various tradeoffs must be made between coupling efficiency, parasitic capacitance, breakdown voltage, geometry and other factors. To that end, it has been discovered that horizontal capacitor structure 10 illustrated in FIG. 1, in comparison to vertical capacitor structure 20 of FIG. 1, provides the best overall performance characteristics in a device where high voltage isolation, high breakdown voltages and good coupling efficiencies are required. Moreover, in horizontal capacitor structure 10 of FIG. 1, if the thickness of electrodes A and C in the top metal layer of horizontal capacitor structure 10 is increased, coupling efficiency $C_{1eff}$ increases because as capacitance $C_1$ increases in response to the thickness of electrodes A and C being increased, parasitic capacitance $C_{p1}$ remains constant. As shown in FIG. 1, electrodes A and C are disposed in the same horizontal plane 30, and thus the breakdown voltage between electrodes A and C, or between electrode A and ground plane substrate D, is always greater than the breakdown voltage between electrode A and electrode B. Thus, in one embodiment of the high voltage isolation semiconductor communication device of the invention, where co-planar sense and drive electrodes are disposed in a single horizontally-oriented plane 30, coupling efficiency is improved while maintaining a high breakdown voltage. Such high coupling efficiency translates directly into improved circuit performance, smaller package or chip area, lower power consumption, and faster data transmission rates.

Figure 2:
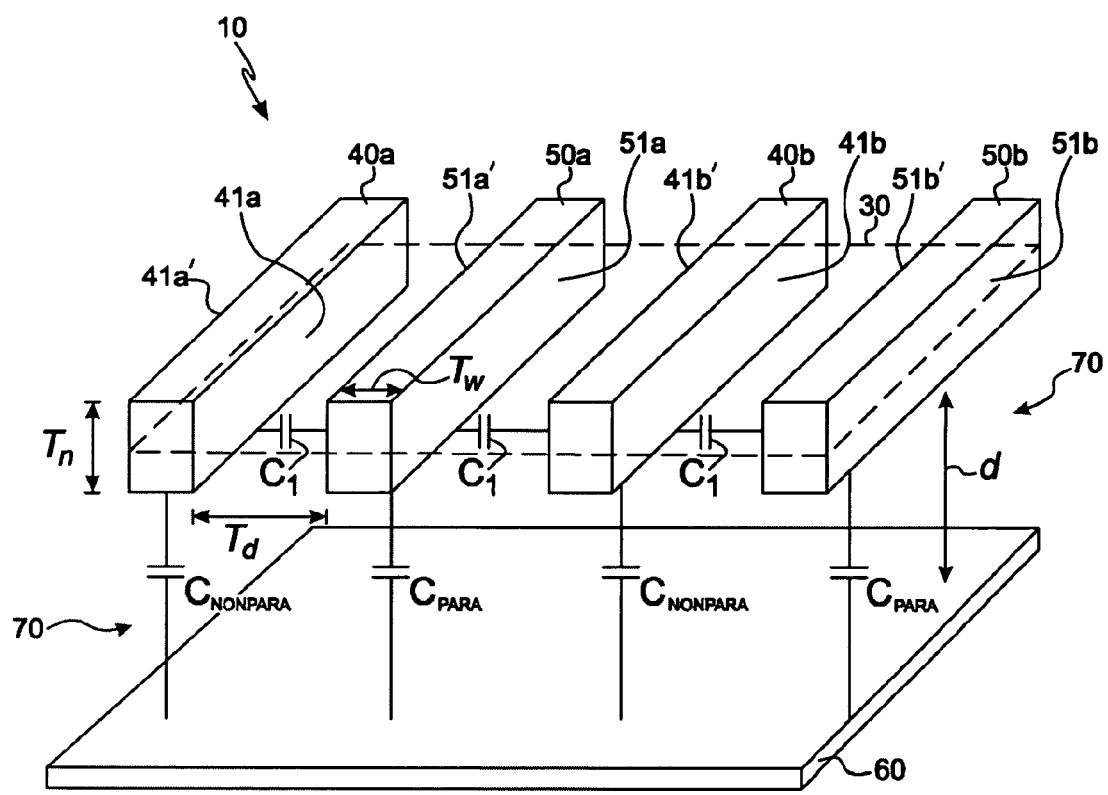
FIG. 2 shows a schematic embodiment of a high voltage isolation semiconductor communication device with co-planar drive and sense electrodes disposed in a single plane.

FIG. 2 shows a schematic embodiment of a high voltage isolation semiconductor communication device with communication drive electrodes 40a and 40b, and communication sense electrodes 50a and 50b disposed substantially in a single horizontal plane 30 positioned above ground plane substrate 60. As shown in FIG. 2, and as in respect of electrodes A and C in FIG. 1, electrodes 40a, 40b, 50a and 50b are co-planar respecting one another and are all disposed substantially within horizontal plane 30. The distance between ground plane substrate 60 and the underside of any of electrodes 40a, 40b, 50a and 50b is approximately equal to d, as further shown by referring to FIGS. 1 and 2. In a preferred embodiment, drive and sense electrodes 40a, 40b, 50a and 50b are separated from electrically conductive ground plane substrate 60 by an electrically insulative layer 70 of thickness d. As shown in FIG. 2, each of electrodes 40a, 40b, 50a, and 50b has opposing substantially vertical sidewalls 41a and 41a', 41b and 41b', 51a and 51a', and 51b and 51b', each such sidewall having a height $T_n$. Note that as sidewall height $T_n$ increases by a factor of x, the electric field density between drive and sense electrodes 40 and 50 may effectively be decreased by a factor of up to x, assuming that inter-electrode spacing $T_d$ remains constant. For example, with all other conditions being constant, if $T_n$ is increased from 1 micron to 3 microns, the electric field density between opposing drive and sense electrodes is reduced by a factor of 2 to 3. Because sidewall heights $T_n$ of drive and sense electrodes 40a, 40b, 50a and 50b are greater than about 1 micron, increased surface area is available on such sidewalls for the electrical field lines emanating therefrom or received thereon. Consequently, the invention has the advantage of providing drive and sense electrodes having reduced electrical field density, which increases the breakdown voltage. In one embodiment, the drive and sense electrodes have an electric field density not exceeding about 400 volts/micron when a voltage placed across the sense and drive electrode ranges between about 2,000 volts RMS and about 3,000 volts RMS.

A drive circuit (not shown in FIG. 2) is operably connected to a drive input of drive electrodes 40a and 40b, while a receive circuit is operably connected to a receive output of sense or receive electrodes 50a and 50b. The drive circuit is configured to transmit a communication drive signal through drive electrodes 40a and 40b, while the receive circuit is configured to receive the communication drive signal transmitted between drive electrodes 40a and 40b and sense electrodes 50a and 50b.

Continuing to refer to FIG. 2, it will be seen that drive and sense communication electrodes 40a, 40b, 50a and 50b are disposed substantially in single plane 30 and are operably configured and associated in respect of one another to effect the transfer of digital communication signals therebetween by capacitive means. In a preferred embodiment, electrode sidewall height $T_n$ exceeds about 1 micron, sense and drive electrodes 40a, 40b, 50a and 50b are separated by an inter-electrode spacing $T_d$ exceeding about 1 micron, and the inter-electrode spacing $T_d$ is greater than or equal to the thickness d. In some embodiments, inter-electrode spacing $T_d$ may be about 1.5 times greater or about 2.0 times greater than the thickness d of electrically insulative layer 70. The sidewall height $T_n$ may range between about 1 micron and about 6 microns, or between about 1 micron and about 3 microns. Inter-electrode spacing $T_d$ may also range between about 1 micron and about 15 microns.

A first breakdown voltage between communication drive electrode 40 and communication sense electrode 50 exceeds about 2,000 volts RMS when applied over a time period of about one minute, about 2,500 volts RMS when applied over a time period of about one minute, or about 3,000 volts RMS when applied over a time period of about one minute. The first breakdown voltage may also be greater than or equal to a second breakdown voltage between the drive electrode and the ground plane substrate. According to UL (UNDERWRITERS LABORATORIES™) Standard 1577, the primary test of a device's insulation performance or capability is the device's ability to withstand the application of high voltages without breaking down. In the test specified in UL 1577, a test is performed where a voltage (ac RMS or DC) is applied between the input and output terminals of a device for one minute. Withstand voltage ratings ranging between about 2,500 $V_{rms}$ and about 5,000 $V_{rms}$ are highly desirable under such test conditions.

Drive and sense electrodes 40a, 40b, 50a and 50b are preferably formed of an electrically conductive metal, a metal alloy or a metal mixture. The metals, metal alloys or metal mixtures employed to form drive and sense electrodes 40a, 40b, 50a and 50b may be the same, or may be different from one another, and may comprise any one or more of gold, silver, copper, tungsten, tin, aluminium, and aluminium-copper. In a preferred embodiment, drive electrodes 40a and 40b, and sense or receive electrodes 50a and 50b, are formed using CMOS metal deposition techniques well known to those skilled in the art, and inter-electrode spacing $T_d$ is provided by controllably etching away metal between adjoining electrodes using, for example, a high density plasma etching technique, and then filling the space defined by inter-electrode spacing $T_d$ with one or more of a semiconductor dielectric material, silicon oxide, silicon nitride, and/or a thick oxide. Care must be taken that voids in the semiconductor dielectric material are not formed, and that the metal layers are etched out anisotropically during the etching process. Well known High Density Plasma ("HDP"), Tetraethylorthosilicate ("TEOS"), and Plasma Enhanced Silicon Nitride ("PESN") passivation techniques may also be employed advantageously when fabricating structure 10.

Electrically insulative layer 70 may be formed using conventional CMOS techniques and materials such as one or more of a semiconductor dielectric material, silicon oxide, silicon nitride, and/or a thick oxide. Underlying ground plane substrate 60 (or D in FIG. 1) is also preferably formed using well-known CMOS techniques, is electrically conductive, and in one embodiment is formed of a semiconductor dielectric material such as silicon.

Note that the invention is not restricted to CMOS techniques. Instead, other techniques are also contemplated and included in the scope of the invention such as Bipolar-CMOS processes, combined Bipolar-CMOS-DMOS (BCD) processes, and indeed any other suitable semiconductor fabrication technique that may be employed to form the co-planar electrodes 40 and 50, insulative layer 70, and ground plane substrate 60. Note also that devices 5 and 10 of the present invention may be encapsulated at least partially in polyimide, plastic or any other suitable packaging or molding material.

Figure 3:
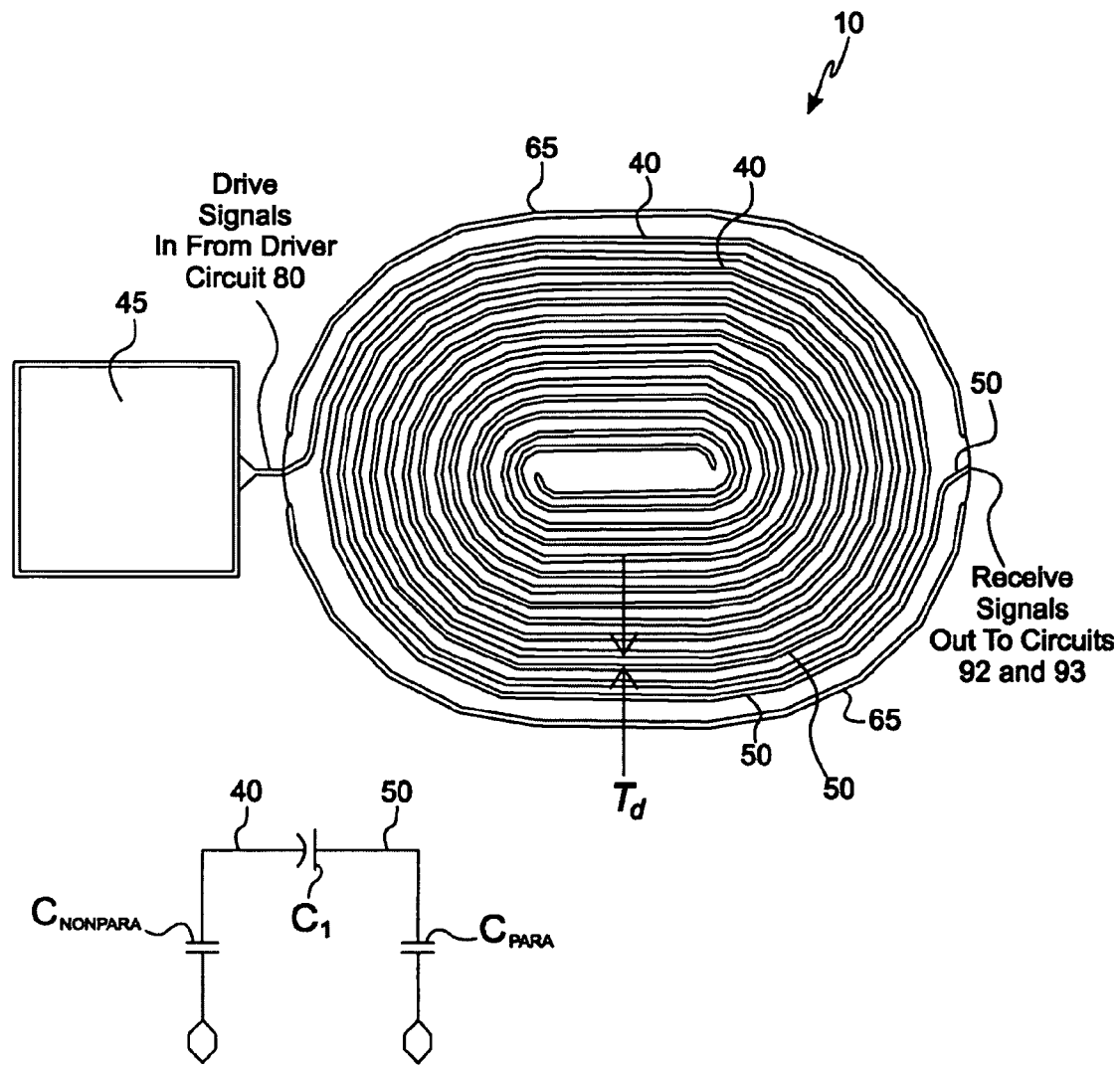
FIG. 3 shows one embodiment of a spirally wound electrode high voltage isolation semiconductor communication device.

Referring now to FIG. 3, there is shown one embodiment of a spirally wound electrode high voltage isolation co-planar horizontal capacitor structure 10, where drive electrode 40 is spirally wound around corresponding sense electrode 50, and drive electrode 40 is electrically connected to pad 45 (which in turn is connected to driver circuit 80, not shown in FIG. 3). High voltage isolation shield 65 surrounds and provides some degree of EMI protection for spirally wound electrodes 40 and 50, and further serves to protect or shield other electronic components or devices from the electrical fields generated by horizontal capacitor structure 10. Note that two or more horizontal capacitor structures 10 can be utilized in a single package or chip 5 so that fully differential communication signals can be transmitted by driver circuit 80 and received by receiver circuit 90 (not shown in FIG. 3), and so that common mode rejection ("CMR") of undesired noise and artifacts can be maximized. As in the embodiment illustrated in FIG. 2, conventional CMOS techniques are most advantageously employed to form spirally wound electrode high voltage isolation co-planar horizontal capacitor structure 10 of FIG. 3.

Figure 4:
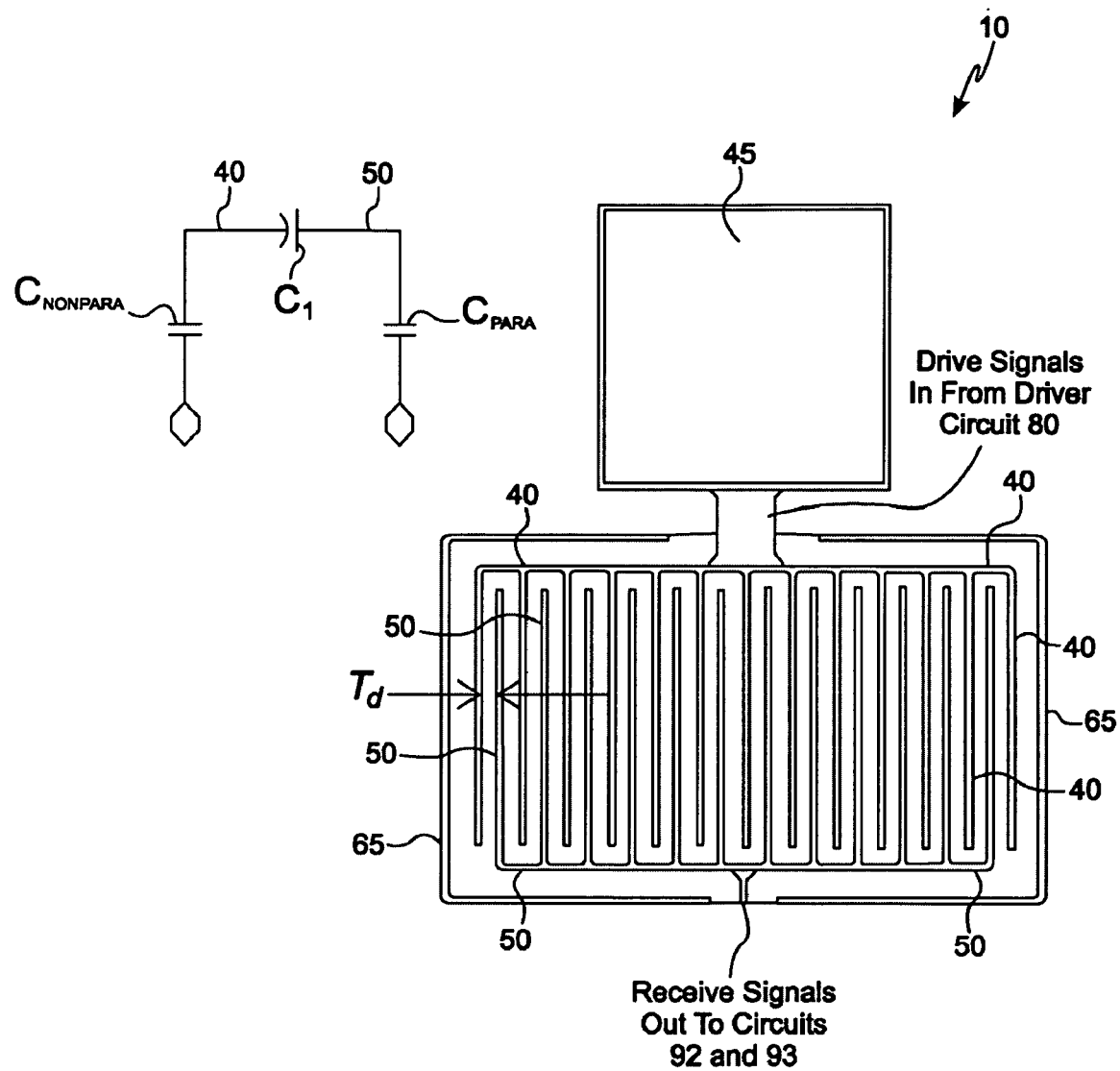
FIG. 4 shows another embodiment of a high voltage isolation semiconductor communication device with interleaved drive and sense electrodes.

Referring now to FIG. 4, there is shown one embodiment of a interleaved electrode high voltage isolation co-planar horizontal capacitor structure 10, where drive electrode 40 has fingers interleaved with corresponding fingers of sense electrode 50. Drive electrode 40 is electrically connected to pad 45 (which in turn is connected to driver circuit 80, not shown in FIG. 4). High voltage isolation shield 65 surrounds and provides some degree of EMI protection for interleaved electrodes 40 and 50, and further serves to protect or shield other electronic components or devices from the electrical fields generated by structure 10. Note that two or more devices 10 can be utilized in a single package or chip 5 so that fully differential communication signals can be transmitted by driver circuit 80 and received by receiver circuit 90 (not shown in FIG. 4), and so that common mode rejection ("CMR") of undesired noise and artifacts can be maximized. As in the embodiment illustrated in FIG. 2, conventional CMOS techniques are most advantageously employed to form interleaved electrode high voltage isolation co-planar horizontal capacitor structure 10 of FIG. 4. Note further that horizontal capacitor structure 10 of FIG. 4 includes a plurality of drive electrodes 40 interleaved with a plurality of sense electrodes 50, although the respective electrodes are connected electrically in parallel with one another.

Figure 5:
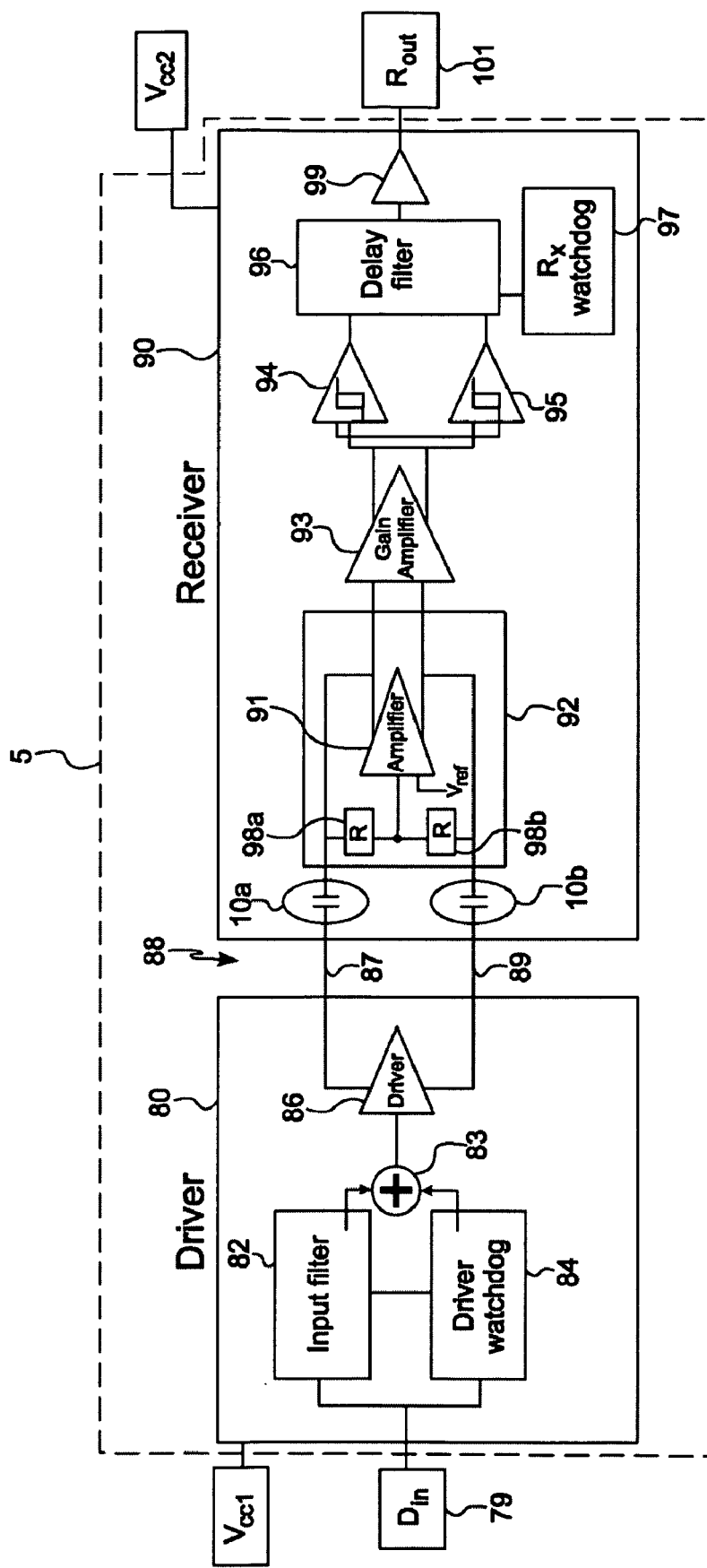
FIG. 5 shows one embodiment of a functional block diagram for driver and receiver circuits in a high voltage isolation semiconductor communication device.

FIG. 5 shows one embodiment of a functional block diagram for driver and receiver circuits 80 and 90 in high voltage isolation semiconductor communication device 5. In FIG. 5, input communication signals are provided to input $D_{in}$ 79 of driver circuit 80, where they are filtered by input filter circuit 82, summed according to an output provided by driver watchdog 84, and transmitted across boundary 88 through wirebonds 87 and 89 to horizontal capacitor structures 10a and 10b. Driver circuit 86 effects the transmission of communication signals across boundary 88 to receiver circuit 90. The output provided by CMR circuit 92 is routed to gain amplifier circuit 93, which provides outputs to comparator/RS flip-flops 94 and 95, whose outputs in turn are routed to delay filter circuit 96. A final output signal from receiver circuit 90 is provided by output buffer 99 at $R_{out}$ 101.

In the embodiment shown in FIG. 5, driver circuit 80 and receiver circuit 90 operate in a fully differential configuration, which has the advantage of rejecting undesirable common mode signals such as noise that may be present in the signal path. The embodiment shown in FIG. 5 achieves high common mode rejection performance. Input signals originating at driver circuit 80 are transmitted across isolation boundary 88 (which from a functional perspective includes electrically insulative material disposed between adjoining drive and sense electrodes, not shown explicitly in FIG. 5) as signal transitions, which in a preferred embodiment are transmitted fully differentially and decoded by receiver circuit 90. Fully differential signals received by sense electrodes in horizontal capacitor structures 10a and 10b are routed through common mode rejection ("CMR") circuit 92 through CMR resistors 98a and 98b. In the embodiment illustrated in FIG. 5, CMR circuit 92 regulates the common mode level of the fully differential inputs from horizontal capacitor structures 10a and 10b. Note, however, that the invention includes within its scope embodiments not having CMR circuit 92 or not having fully differential inputs provided thereto.

Some embodiments feature only one pair of isolated co-planar horizontal capacitor structures 10 to transmit and receive digital communication data, as well as to maintain signal transfer between drive and sense electrodes 40 and 50, and do not require a separate data refresh capacitor circuit. Receiver circuit 90 shown in FIG. 5 may also be configured to correctly decode signals received from driver circuit 80 and provide faithfully and highly accurately reproduced versions of input signals provided to input 79 at output 101.

Figure 6:
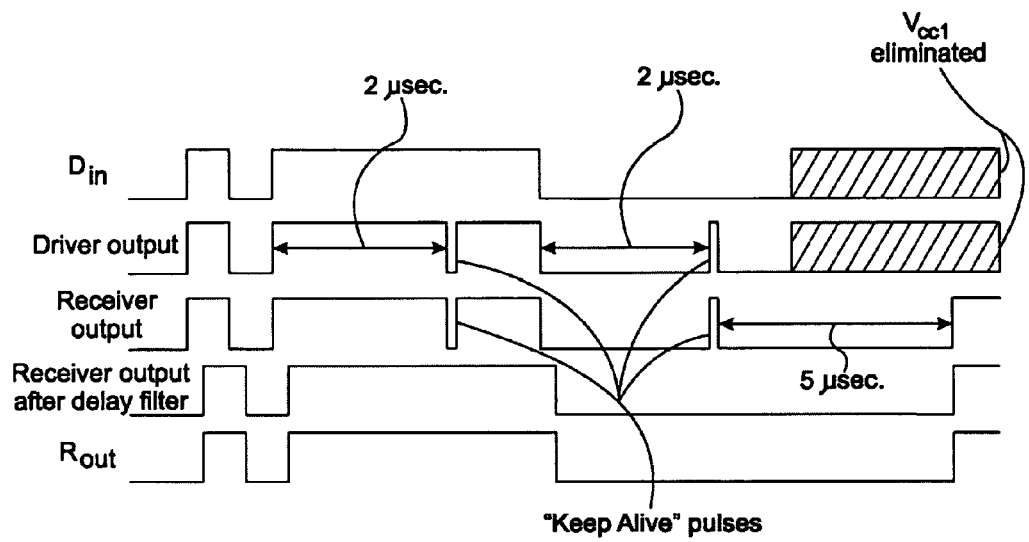
FIG. 6 shows waveforms produced by the circuits of FIG. 5 when a data-out signal defaults to a high state.
Figure 7:
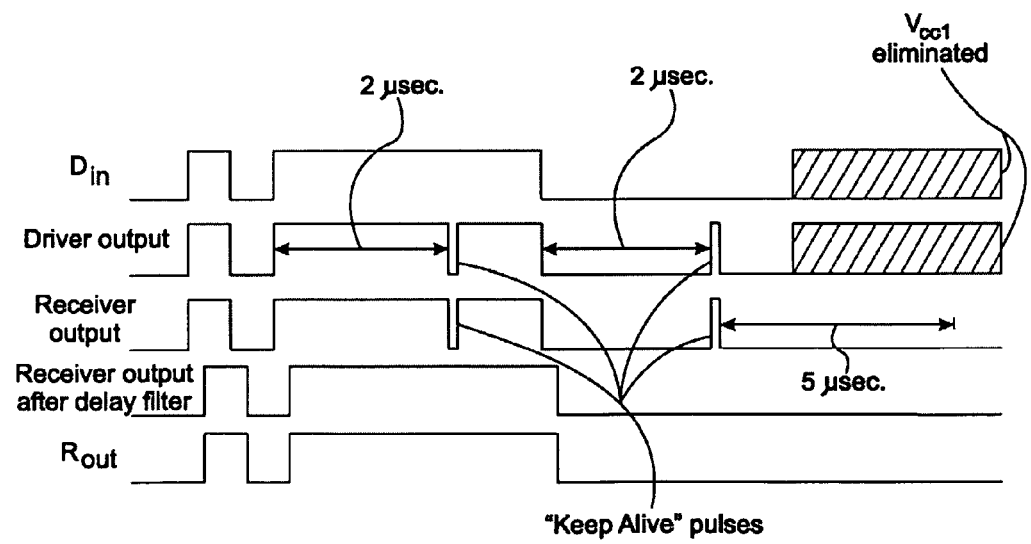
FIG. 7 shows waveforms produced by the circuits of FIG. 5 when a data-out signal defaults to a low state.

FIG. 6 shows waveforms produced by circuits 80 and 90 of FIG. 5 when a data-out signal defaults to a high state, while FIG. 7 shows waveforms produced by circuits 80 and 90 of FIG. 5 when a data-out signal defaults to a low state. Referring now to FIGS. 5 through 7, output comparator/RS flip-flops 94 and 95 are set and reset according to outputs provided by circuit 93. Driver circuit 86 is operably connected to driver watchdog circuit 84, which is configured to transmit pulses to receiver circuit 90 to maintain signals transmitted across boundary 88, which properly maintains the DC state of receiver circuit 90 in respect of signals received thereby. In the embodiment illustrated in FIG. 5, if a DC state in receiver circuit 90 is to be maintained longer than about 2 μsec. a "keep alive" pulse is transmitted from driver watchdog circuit 84 of driver circuit 80 to receiver circuit 90. As illustrated in FIGS. 6 and 7, the output provided by receiver circuit 90 at $R_{out}$ 101 defaults to a high or a low state after 5 μsec. when driver circuit 80 is no longer powered up and in consequence "keep alive" pulses are no longer received by receiver circuit 90 from driver circuit 80.

Continuing to refer to FIGS. 5 through 7, it will be seen that the transmit function of driver circuit 80 is effected by input filter circuit 82, summation block circuit 83, driver watchdog circuit 84 and single-to-differential driver circuit 86. Input filter circuit 82 is employed to ensure a pulse having a minimum width of 3 nanoseconds is filtered so as not to confuse the state machine of receiver circuit 90. The single ended to differential conversion effected by driver circuit 86 is preferably implemented with minimal skew. In addition to sending "keep alive" pulses to receiver circuit 90, driver watchdog circuit 84 may also be employed to monitor incoming data signals.

Data transmitted across boundary 88 from driver circuit 80 are differentiated when received by gain amplifier 93. Differentiation occurs due to the transmission and reception characteristics of drive and sense electrodes 40 and 50 in horizontal capacitor structures 10a and 10b, as well as those of receiver common mode resistors 98a and 98b. The amplitudes of signals initially received by receiver circuit 90 are set by the ratios of coupling capacitors $C_1$ in horizontal capacitor structures 10a and 10b, and the respective parasitic capacitances ($C_{para}$) associated therewith. The receiver circuit's input common mode is established by CMR circuit 92. In normal operation, CMR circuit 92 drives zero current into common mode resistors 98a and 98b. During a CMR event, large common mode currents are pushed or pulled into the output terminals of amplifier 91. Large dV/dT currents are created by coupling capacitors $C_1$ in conjunction with changing ground potential differences arising between driver circuit 80 and receiver circuit 90, which in a preferred embodiment each comprise separate integrated circuits (ICs). To maintain a proper common mode voltage at the input terminals of amplifier 91, CMR circuit 92 must apply a compensating current to CMR resistors 98a and 98b.

Note that without CMR circuit 92, some CMR events would drive the voltage at the sense electrodes of the receiver circuit 90 to ground or $V_{DD}$. In such a scenario, the sense electrodes would be clamped by diodes, for example, connected to the backsides of coupling capacitors $C_1$. The clamped inputs would result in all data being lost.

In one embodiment, CMR circuit 92 is designed to compensate for CMR events characterized by values less than or equal to 25 kV/μsec., which may be accomplished by forcing current into or away from the receiver inputs. As a result, receiver circuit 90 may be configured to recover data in the presence of CMR events which do not exceed 25 kV/μsec. CMR events that exceed such a threshold may result in data loss or errors. In some embodiments, data communication rates achieved by device 10, where digital data are transferred by capacitive means between driver circuit 80 and receiver circuit 90, may range up to or even exceed about 300 Megabits per second.

Figure 8:
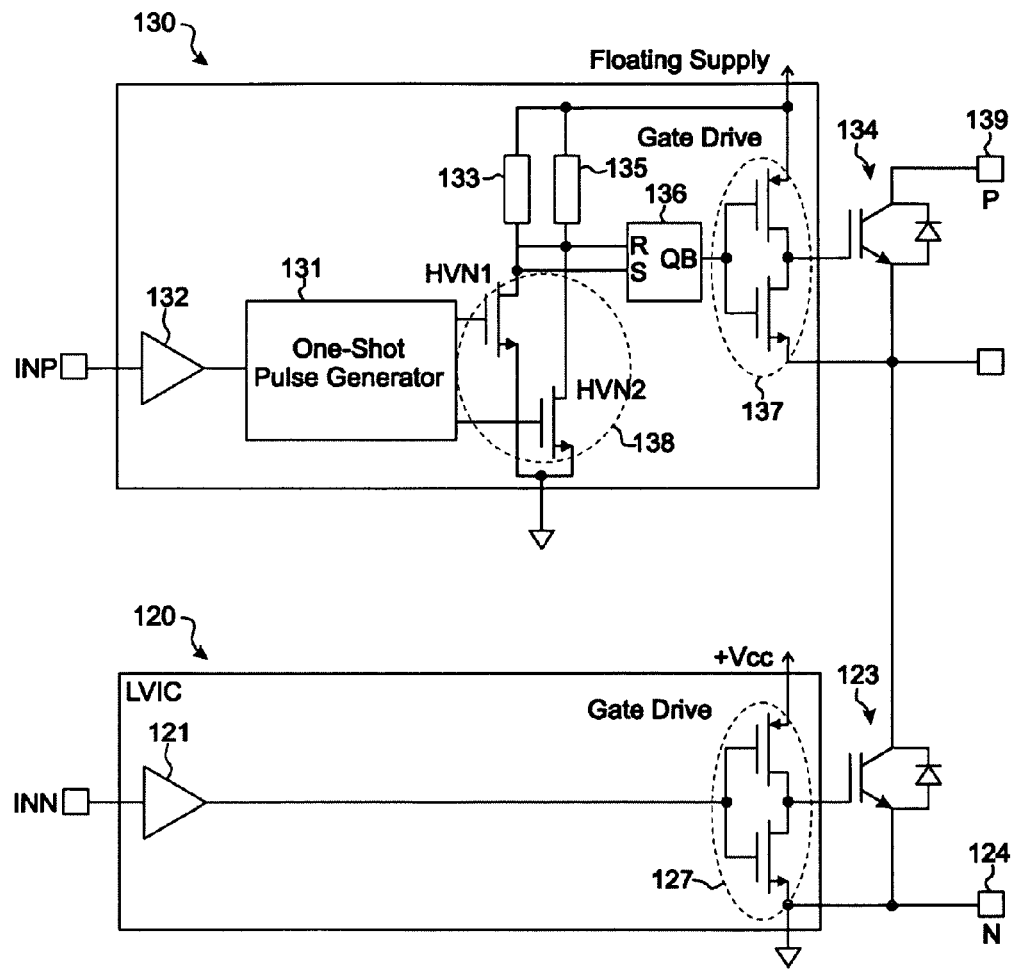
FIG. 8 shows a prior art high voltage integrated circuit gate drive circuit.

As mentioned above, HVICs may be employed in power systems and other applications to provide level shifting and gate drive functionality for high side insulated-gate bipolar transistors (IGBTs). A conventional prior art HVIC gate drive typically requires the use of high voltage transistors to implement such high voltage level shift functionality. FIG. 8 shows one example of such a prior art gate drive circuit. The HVIC operates off a floating power supply and provides the level shift and gate drive for the P-side or high side IGBT 134. Low voltage integrated circuit (LVIC) 120 gate drive circuit operates off the low side supply of $V_{cc}$ and provides the gate drive for the N-side or low side IGBT 123. $V_{cc}$ is typically +15 volts, but of course may assume any appropriate or suitable value, depending on the particular application and circuitry at hand. During operation of the HVIC illustrated in FIG. 8, the P-side input is routed through one-shot pulse generator 131 configured to generate turn-on pulses for high voltage level shift MOSFETs HVN1 and HVN2 at 138. Transistors HVN1 and HVN2 then pull the inputs to high side driver latch 136 low to set and reset the gate drive for P-side IGBT 134.

One disadvantage of the circuit shown in FIG. 8 is that high voltage transistors HVN1 and HVN2 at 138 are used for level shifting, and as a result a high voltage manufacturing process such as that provided by using SOI technology is required. The complexity and high cost of such processes render conventional gate drivers as uneconomic cost solutions. Besides, as the level of high voltage stress between the low and high side of the gate drive increases, migration to a correspondingly higher voltage process is necessary, resulting in even higher manufacturing costs.

Figure 9:
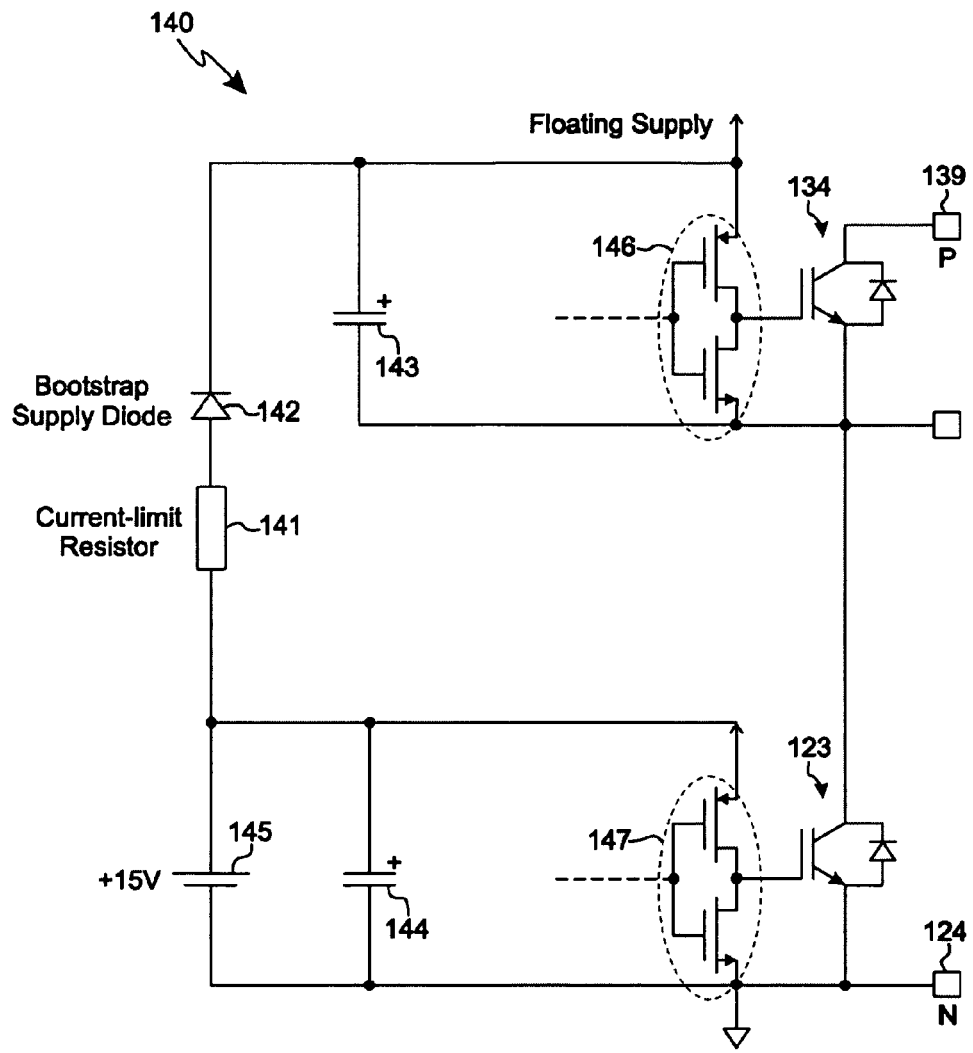
FIG. 9 shows a prior art bootstrap power supply circuit.

As shown in FIG. 9, in some prior art gate drive circuits a floating power supply for the high side gate drive is supplied by an external bootstrap circuit 140. This type of circuit usually includes a fast recovery bootstrap diode 142 with a small series resistor 141 to limit the peak charging current, and a reservoir capacitor 143 to hold the floating power supply. When the low side IGBT is turned on, reservoir capacitor 143 for the floating supply is charged through bootstrap diode 142. When the low side IGBT is turned off, the energy stored in reservoir capacitor supplies 143 the power for high side gate drive 134. To reduce power consumption, the current provided to gate drive 146 and its associated level shift transistors and logic circuit is limited to keep the current drawn from the floating supply low, which in turn compromises the speed of the gate drive. As a result, and in addition to the expensive and elaborate SOI manufacturing techniques typically employed to fabricate them, the performance characteristics of prior art HVIC gate drive circuits may be less than optimal.

An alternative to the above-described prior art circuits and methods is to employ capacitive isolation techniques in high voltage gate drive circuits, where a signal is sent from an input low voltage side across a capacitive isolation barrier to a high side gate drive, which controls the gate voltage of an IGBT. Such an alternative eliminates the need to use expensive or slow high voltage transistors as a means of providing level shift functionality. According to one embodiment, capacitive isolation circuitry is provided using a standard CMOS or related manufacturing process, which is simple and highly cost effective. This stands in contrast to prior art methods of providing shift level functionality with conventional gate drive circuitry manufactured using high voltage processes such as SOI, which is expensive and requires complex processing.

Figure 10:
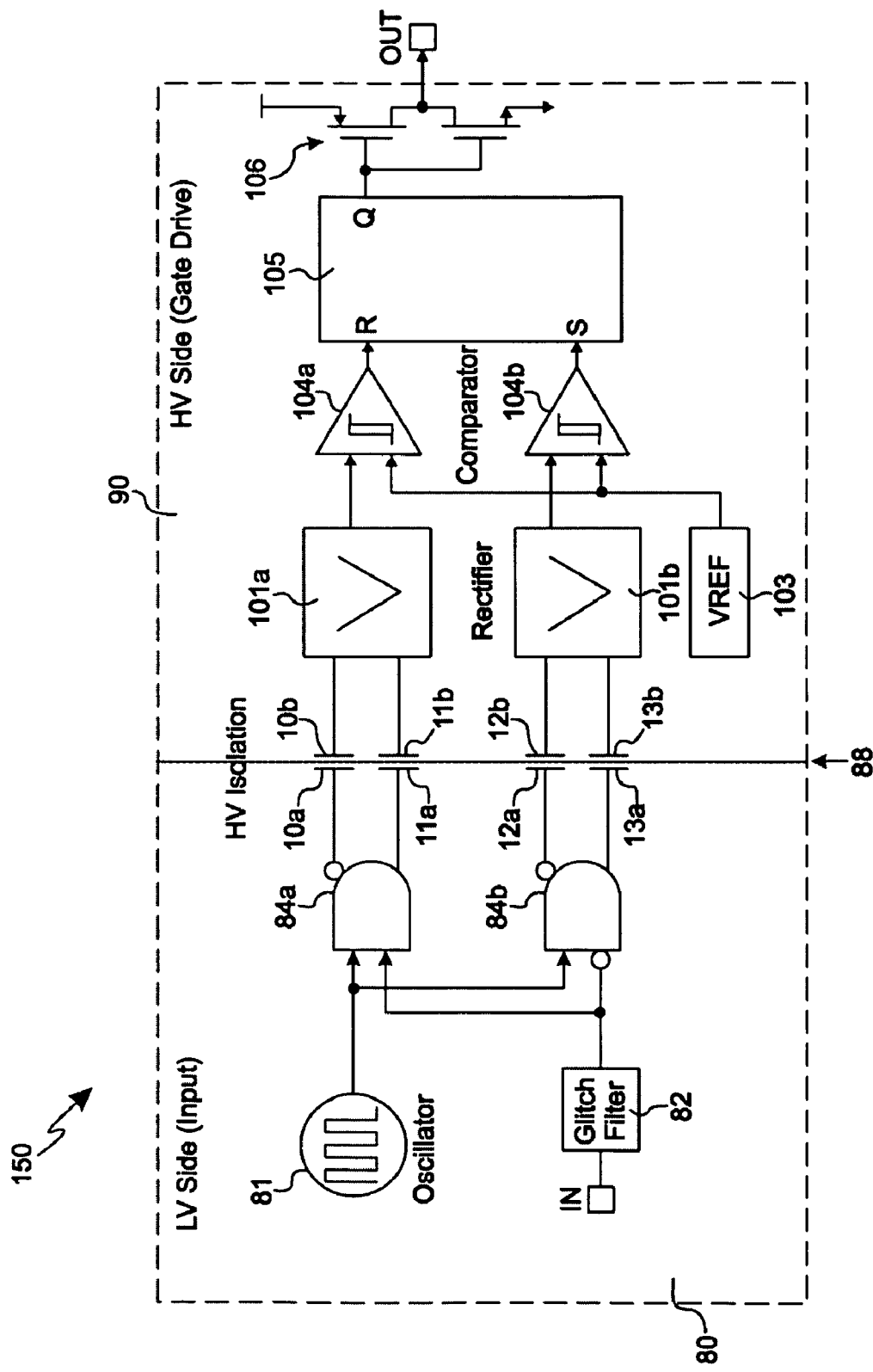
FIG. 10 shows one embodiment of a high voltage gate drive circuit.

One embodiment of a high voltage gate drive circuit 150 which employs capacitive isolation is depicted in FIG. 10, where high voltage isolation is provided by capacitors 10a through 13b constructed using metal-to-metal layers fabricated using a standard CMOS process. As discussed in detail above, coplanar capacitance is provided by horizontal coupling between the sidewalls of adjoining metal layers. If metal is used to construct the capacitor in the top layer only, parasitic capacitance from the metal layer to the substrate is minimized, thereby maximizing coupling when a signal is transmitted across the isolation barrier. The construction of such a capacitive isolation barrier, as well as some of the techniques for transferring signals across the barrier, are described in detail above.

Continuing to refer to FIG. 10, in one embodiment the low voltage side 80 of the system includes an input glitch filter 82, a low power oscillator 81, and a pair of logic drivers 84*a* and 84*b*. The input signal is first routed through glitch filter 82 to remove any glitches, spikes or other undesired anomalies that may be present in the input signal. The filtered signal then drives one input of each of the logic drivers 84*a* and 84*b* in a complementary manner. The other input of each of the logic drivers is driven by oscillator 81. Depending on the particular input logic employed in circuit 80, the oscillator output will appear at the output of only one of the logic gates. Since the output of only one of the logic gates is enabled, at any given moment in time only one of the upper pair of capacitors (i.e., 10*a*/10*b* and 11*a*/11*b*) or the lower pair of capacitors (i.e., 12*a*/12*b* and 13*a*/13*b*) is driven. Consequently, the signal coupled across capacitive isolation barrier 88 is differentiated according to the input logic level. By using a single pair of capacitors for signal coupling in each channel, excellent common mode rejection characteristics are provided.

In the embodiment of the circuit shown in FIG. 10, the high voltage side 90 of the system consists of pairs of rectifiers 101*a*/101*b* and comparators 104*a*/104*b*, an R-S latch 105, an output gate driver stage 106, and a reference bias block 103. The oscillator output signal coupled through isolation barrier 88 is rectified and filtered. Each of comparators 104*a* and 104*b* compares the coupled signal to a reference level voltage. When the amplitude of the coupled signal becomes sufficiently high and crosses a predetermined reference level, the comparator is tripped and its output state is toggled. The output of each of the comparators then drives the reset and set inputs of latch 105. The output of the RS flip-flop 105 then drives the output gate drive stage 106.

Figure 11:
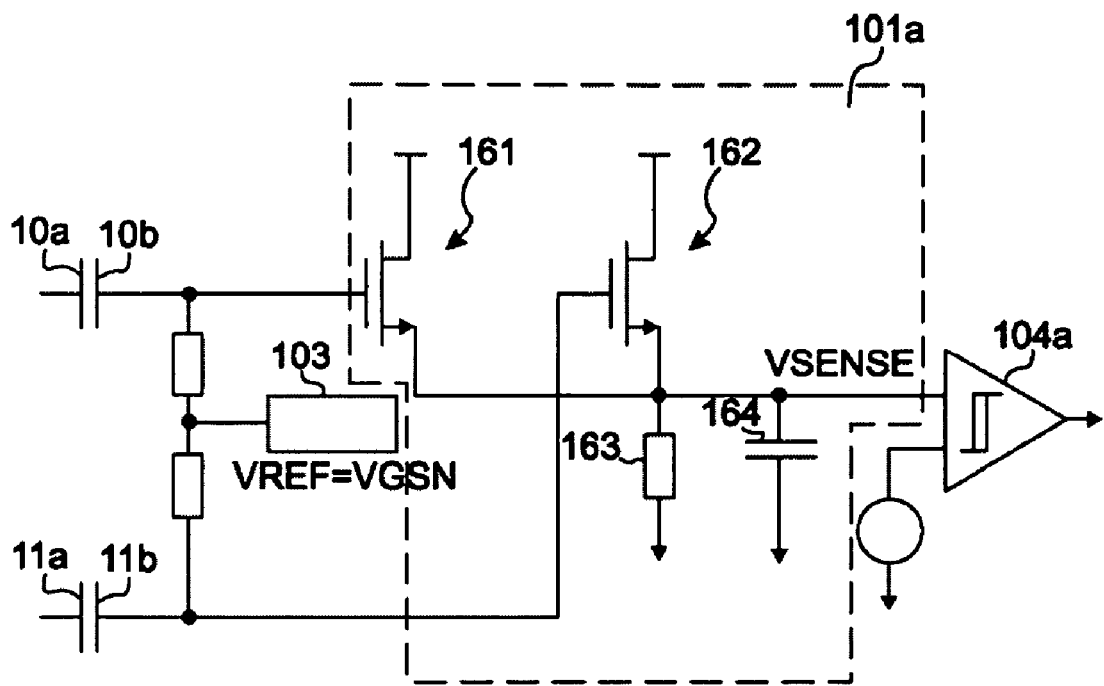
FIG. 11 shows one embodiment of a rectification and sensing circuit.

FIG. 11 shows one embodiment of a rectification and sensing circuit for signals coupled to the high voltage side 90. When oscillation is not occurring, VSENSE will be biased close to 0 volts because the common mode reference level is set at VGSN. This reduces the current dissipated. Concurrently, the output of the comparator is in a default state of logic low. When oscillation is occurring, MOSFETs 161 and 162 configured as source followers drive VSENSE to become a full wave rectified version of the incoming oscillation. Resistor 163 and capacitor 164 form a simple low-pass filter to filter the VSENSE signal to permit signal comparison. The low-pass filter is most preferably configured to filter ripple below the hysteresis level of comparator 104*a* or 104*b* and thereby avoid chattering. When the filtered VSENSE voltage level crosses the reference level, the comparator output is configured to change state. The comparator output then sets or resets the state of R-S latch 105, which subsequently drives the gate drive. Since DC information is preserved across the isolation barrier owing to the use of two channels to encode high and low voltage states, DC refresh circuitry is not required. Since gate drivers operate primarily at low frequencies, common mode disturbance to the system in the event a high frequency common mode transient is injected therein is naturally filtered out. As a result, common mode amplifier design requirements can be relaxed substantially, which in turn permits low power circuitry to be employed on the receiver side. One important design objective is to keep current consumption on the high side of the circuit low so that simple yet efficient design of a bootstrap supply circuit for the high side of the gate drive can be achieved.

The capacitive isolation circuits and methods described above provide important advantages over conventional gate drive circuits and methods. First, the choice of the capacitor structure is significant to the overall system design. Any monolithic capacitor structure features parasitic capacitance between the bottom plate of the capacitor and the substrate. Because parasitic capacitance contributes to signal loss, it is desirable to employ a structure having a small associated parasitic capacitance. In the case of a coplanar capacitor structure comprising only a top metal layer, parasitic capacitance is most significant between the top level metal layer and the substrate. Contrariwise, in a stacked capacitor comprising several vertically-stacked metal layers, parasitic capacitance arises primarily between the bottom-most metal layer and the substrate. Since the distance between the top metal layer and the substrate in a co-planar capacitor is substantially greater than the distance that the bottom-most metal layer and the substrate in a vertically stacked capacitor, the parasitic capacitance of the coplanar disclosed herein structure is much lower. As a result, the coplanar capacitor provides superior signal transfer gain compared to a vertically stacked capacitor. High signal transfer gain permits simplification of the design of the receiver circuit, which in turn reduces power consumption and also helps simplify the design of any associated bootstrap supply circuitry.

Second, to further reduce power dissipation on the high side of the circuit, the strength of the drive signal transmitted to the high side can be improved. This can be achieved by voltage multiplying the oscillator voltage through a charge pump circuit. In doing so, the drive signal sent across the isolation barrier is increased by a factor n, where n is the voltage gain of the charge pump circuit, and n>1. Having a higher signal level on the high side means the signal processing circuit on the receiver side of the circuit can be simplified, thereby leading to a lower power receiver circuit. Higher signal levels also permit the design of the bootstrap supply circuit to be simplified.

Third, although two communication channels are shown in FIG. 10, one or more additional communication channels may be added at minimal incremental cost so that one or more additional logic states can be transmitted across the isolation barrier. For example, an additional logic state can be used to encode a HiZ state on the high side. Implementing such an additional logic state in a conventional gate drive circuit would require an extra pair of high voltage transistors, which in turn would require increased area for the circuit and higher manufacturing costs.

Fourth, since isolation capacitance circuitry is employed as a signal transfer medium rather than high voltage level shift transistors, it is possible to transfer signals in the opposite direction, i.e., from the high side back to the low side of the circuit. For example, signals indicative of feedback and/or fault conditions from the high side of the circuit associated therewith can be transmitted back to the low side of the circuit. Since a capacitor can operate as a bidirectional transducer, such a feedback configuration can share the same pair of signal capacitors as those employed to transmit signals in the forward direction to the high side of the circuit. Alternatively, an additional pair of capacitors can be added to the circuit at minimal cost to provide feedback information from the high side of the circuit. Such functionality is impossible or very difficult to implement in a conventional gate drive circuit because the level shift functionality provided by high voltage transistors works in one direction only (namely, from the low side to the high side).

It will now become apparent to those skilled in the art that the various embodiments of the invention disclosed herein provide several advantages, including, but not limited to providing improved circuit performance, smaller packages or chips, lower power consumption, faster data transmission rates, and significantly lower manufacturing cost without sacrificing performance.

Note that the terms "vertical" and "horizontal" employed herein are intended to refer to the relative orientations of capacitor planes as they relate to underlying or overlying ground plane substrates 60. Thus, while a device made in accordance with the teachings of the invention might, in fact, have co-planar digital data communication electrodes disposed in a single plane, and the single plane is vertically oriented but is parallel or substantially parallel to the ground plane substrate, such a device would nevertheless fall within the scope of the invention.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A high voltage drive circuit, comprising:
   at least one drive electrode comprising a drive input connected to a low voltage portion of the circuit, the drive electrode being formed of a first electrically conductive metal, metal alloy or metal mixture;
   at least one sense electrode comprising a sense output connected to a high voltage portion of the circuit, the sense electrode being formed of a second electrically conductive metal, metal alloy or metal mixture;
   an electrically conductive ground plane substrate spaced apart from the drive and sense electrodes by an electrically insulative layer;
   a drive circuit forming a portion of the low voltage portion and configured to receive an input signal provided to the high voltage drive circuit, the drive circuit being operably coupled to the drive input and configured to transmit a drive signal based on the input signal therethrough, and
   a receive circuit forming a portion of the high voltage portion and operably coupled to the sense output, the receiver circuit being configured to receive the drive signal transmitted between the sense and drive electrodes and to provide at least one gate drive output signal having power and amplitude sufficient to drive an insulated-gate bipolar transistor (IGBT);
   wherein the drive and sense electrodes are substantially disposed in a single plane and are operably configured and associated in respect of one another to effect the transfer of drive signals therebetween by capacitive means, the gate drive circuit is a non-silicon-on-insulator CMOS integrated circuit, and high voltage isolation between the low and high voltage portions of the circuit is provided by the drive and sense electrodes.

2. The high voltage drive circuit of claim 1, wherein the low voltage portion further comprises a glitch filter configured to filter the input signal.

3. The high voltage drive circuit of claim 1, wherein the low voltage portion further comprises an oscillator circuit configured to provide an output oscillator signal.

4. The high voltage drive circuit of claim 1, wherein the at least one drive electrode and the at least one sense electrode comprise a plurality of pairs of drive and sense electrodes forming a plurality of driver channels.

5. The high voltage drive circuit of claim 1, wherein the at least one drive electrode and the at least one sense electrode comprise first and second pairs of drive and sense electrodes forming first and second driver channels.

6. The high voltage drive circuit of claim 1, wherein the receive circuit further comprises an output gate driver stage.

7. The high voltage drive circuit of claim 1, further comprising a bootstrap supply circuit.

8. The high voltage drive circuit of claim 1, wherein a first breakdown voltage between the at least one drive electrode and the at least one sense electrode exceeds about 2,000 volts RMS when applied over a time period of about one minute.

9. The high voltage drive circuit of claim 1, wherein an inter-electrode spacing $T_d$ between the drive electrode and the sense electrode is at least about 1.5 times greater than a thickness d of the electrically insulative layer.

10. The high voltage drive circuit of claim 1, wherein the first and second metals, metal alloys or metal combinations comprise one or more of gold, silver, copper, tungsten, tin, aluminium, and aluminium-copper.

11. The high voltage drive circuit of claim 1, wherein the electrically insulative layer comprises one or more of a semiconductor dielectric material, silicon oxide, silicon nitride and thick oxide.

12. The high voltage drive circuit of claim 1, wherein the electrically conductive ground plane substrate is formed of a semiconductor dielectric material or silicon.

13. The high voltage drive circuit of claim 1, wherein the drive and sense electrodes, the electrically insulative layer, and the ground plane substrate are fabricated using one or more of a CMOS process, a Bipolar-CMOS process, and a combined Bipolar-CMOS-DMOS (BCD) process.

14. The high voltage drive circuit of claim 1, wherein the circuit is encapsulated at least partially in polyimide or plastic.

15. The high voltage drive circuit of claim 1, wherein the drive and receive circuits are incorporated into an integrated circuit.

16. The high voltage drive circuit of claim 1, wherein the receive circuit further comprises a common mode rejection (CMR) circuit.

17. The high voltage drive circuit of claim 1, wherein the device is configured to transfer data between the drive and receive circuits at a rate of up to about 300 Megabits per second.

18. The high voltage drive circuit of claim 3, further comprising a charge pump circuit configured to voltage multiply the output oscillator signal thereby to amplify the drive signal.

19. The high voltage drive circuit of claim 5, wherein the low voltage portion further comprises a pair of logic driver circuits configured to drive the first and second pairs of sense and drive electrodes.

20. The high voltage drive circuit of claim 5, wherein the high voltage portion further comprises first and second rectifiers configured to receive, respectively, first and second sense electrode outputs provided by the first and second pairs of electrodes.

21. The high voltage drive circuit of claim 8, wherein the first breakdown voltage exceeds about 2,500 volts RMS when applied over a time period of about one minute.

22. The high voltage drive circuit of claim 8, wherein the first breakdown voltage exceeds about 3,000 volts RMS when applied over a time period of about one minute.

23. The high voltage drive circuit of claim 8, wherein the first breakdown voltage is greater than or equal to a second breakdown voltage between the drive electrode and the ground plane substrate.

24. The high voltage drive circuit of claim 19, wherein the logic driver circuits are complementary and are further configured to drive the first and second pairs of electrodes alternately.

25. The high voltage drive circuit of claim 20, wherein at least one of the first and second rectifiers comprises at least one MOSFET source follower.

26. The high voltage drive circuit of claim 20, further comprising first and second comparators operably connected to the first and second rectifiers and to receive first and second rectifier outputs therefrom, respectively.

27. The high voltage drive circuit of claim 24, wherein the alternately driven and complementary logic driver circuits are configured to increase common mode rejection between the first and second driver channels.

28. The high voltage drive circuit of claim 25, further comprising a low pass filter configured to filter an output signal provided by the at least one MOSFET source follower and remove or reduce ripple present therein.

29. The high voltage drive circuit of claim 26, wherein the first and second comparators each comprise means for comparing the oscillator output signal to a reference voltage.

30. The high voltage drive circuit of claim 26, further comprising an RS latch configured to receive first and second comparator outputs from the first and second comparators, respectively.

31. The high voltage drive circuit of claim 29, wherein output states provided by the first and second comparators are configured to toggle or not to toggle on the basis of the comparison between the oscillator output signal and the reference voltage.

32. The high voltage drive circuit of claim 29, wherein the electrically insulative material comprises one or more of a semiconductor dielectric material, silicon oxide, silicon nitride and thick oxide.

33. The high voltage drive circuit of claim 30, wherein outputs of the first and second comparators drive set and reset inputs of the RS latch.

34. A method of making a high voltage drive circuit, comprising:
  providing at least one drive electrode comprising a drive input connected to a low voltage portion of the circuit, the drive electrode being formed of a first electrically conductive metal, metal alloy or metal mixture;
  providing at least one sense electrode comprising a sense output connected to a high voltage portion of the circuit, the sense electrode being formed of a second electrically conductive metal, metal alloy or metal mixture;
  providing an electrically conductive ground plane substrate spaced apart from the drive and sense electrodes by an electrically insulative layer;
  providing a drive circuit forming a portion of the low voltage portion and configured to receive an input signal provided to the high voltage drive circuit, the drive circuit being operably coupled to the drive input and configured to transmit a drive signal based on the input signal therethrough, and
  providing a receive circuit forming a portion of the high voltage portion and operably coupled to the sense output, the receiver circuit being configured to receive the drive signal transmitted between the sense and drive electrodes and to provide at least one gate drive output signal having power and amplitude sufficient to drive an insulated-gate bipolar transistor (IGBT);
  wherein the drive and sense electrodes are substantially disposed in a single plane and are operably configured and associated in respect of one another to effect the transfer of drive signals therebetween by capacitive means, the gate drive circuit is a non-silicon-on-insulator CMOS integrated circuit, and high voltage isolation between the low and high voltage portions of the circuit is provided by the drive and sense electrodes.

* * * * *